(12) United States Patent (10) Patent No.: US 12,354,978 B2
Chiu et al. (45) Date of Patent: Jul. 8, 2025

(54) COUPLED LOOP AND VOID STRUCTURE INTEGRATED IN A REDISTRIBUTION LAYER OF A CHIP PACKAGE

(71) Applicant: XILINX, INC., San Jose, CA (US)

(72) Inventors: Po-Wei Chiu, Hsinchu (TW); Tzu-No Chen, Kaohsiung (TW); Hong Shi, Los Gatos, CA (US); Li-Sheng Weng, San Diego, CA (US); Young Soo Lee, Santa Clara, CA (US)

(73) Assignee: XILINX, INC., San Jose, CA (US)

( * ) Notice: Subject to any disclaimer, the term of this patent is extended or adjusted under 35 U.S.C. 154(b) by 520 days.

(21) Appl. No.: 17/724,063

(22) Filed: Apr. 19, 2022

(65) Prior Publication Data

US 2023/0335510 A1 Oct. 19, 2023

(51) Int. Cl.
*H01L 23/64* (2006.01)
*H01L 23/00* (2006.01)
*H01L 23/498* (2006.01)

(52) U.S. Cl.
CPC ...... *H01L 23/645* (2013.01); *H01L 23/49822* (2013.01); *H01L 23/49838* (2013.01); *H01L 24/16* (2013.01); *H01L 2224/16227* (2013.01)

(58) Field of Classification Search
CPC ............. H01L 23/645; H01L 23/49822; H01L 23/49838; H01L 24/16; H01L 2224/16227; H01L 23/5222; H01L 23/3128; H01L 2224/0235; H01L 2224/02371; H01L 2224/02375; H01L 2224/0401; H01L 23/5227; H01L 23/5385; H01L 23/49816

USPC ......................................................... 257/668
See application file for complete search history.

(56) References Cited

U.S. PATENT DOCUMENTS

| | | | |
|---|---|---|---|
| 6,661,088 B1 * | 12/2003 | Yoda | H01L 23/481 |
| | | | 257/784 |
| 8,143,987 B2 | 3/2012 | Kireev | |
| 8,592,943 B2 | 11/2013 | Wu et al. | |
| 8,823,133 B2 | 9/2014 | Jenkins et al. | |
| 8,860,180 B2 | 10/2014 | Jing et al. | |
| 9,330,823 B1 | 5/2016 | Rahman et al. | |
| 9,373,605 B1 * | 6/2016 | Wang | H01L 25/50 |
| 9,406,738 B2 | 8/2016 | Kireev et al. | |
| 10,892,087 B1 * | 1/2021 | She | H01L 28/10 |
| 11,043,470 B2 | 6/2021 | Jing et al. | |
| 2011/0248811 A1 * | 10/2011 | Kireev | H01L 23/5227 |
| | | | 336/200 |
| 2017/0148750 A1 * | 5/2017 | Saraswat | H01L 23/481 |
| 2018/0374803 A1 * | 12/2018 | Aoki | H01L 23/49838 |
| 2021/0193638 A1 * | 6/2021 | Ito | H01L 23/5227 |

(Continued)

*Primary Examiner* — Eva Y Montalvo
*Assistant Examiner* — Nicholas B Michaud
(74) *Attorney, Agent, or Firm* — Patterson + Sheridan, LLP

(57) ABSTRACT

Disclosed herein is a chip package and method for fabricating the same are provided that includes a redistribution layer (RDL) with a plurality of loop and void structures. The chip package includes an integrated circuit (IC) die, and a package substrate. The RDL is disposed between the IC die and the package substrate. The RDL has RDL circuitry that connects the IC die to the package substrate. The RDL circuitry includes a first coil formed in a first metal layer and a second coil formed in a second metal layer. A first end of the second coil is coupled to a second end of the first coil by a first via. A second end of the second coil is the IC die.

20 Claims, 7 Drawing Sheets

(56) References Cited

U.S. PATENT DOCUMENTS

2022/0238448 A1* 7/2022 Halim ................. H01L 23/5384
2023/0299044 A1* 9/2023 Collins ................ H01L 23/642
                                                           257/659

* cited by examiner

ND VOID STRUCTURE
COUPLED LOOP AND VOID STRUCTURE INTEGRATED IN A REDISTRIBUTION LAYER OF A CHIP PACKAGE

TECHNICAL FIELD

Examples of the present invention generally relate to a chip package having a redistribution layer with a plurality of loop and void structures, and a method of fabrication the same.

BACKGROUND

Electronic devices, such as tablets, computers, copiers, digital cameras, smart phones, control systems, automated teller machines, data centers, artificial intelligence system, and machine learning systems among others, often employ electronic components which leverage chip package assemblies for increased functionality and higher component density. Conventional chip packaging schemes often utilize a package substrate, often in conjunction with a through-silicon-via (TSV) interposer substrate, to enable a plurality of integrated circuit (IC) dies to be mounted to a single package substrate. The IC dies are mounted to a die side (i.e., top surface) of the package substrate while a ball side (i.e., bottom surface) of the package substrate is mounted to a printed circuit board (PCB). The IC dies may include memory, logic or other IC devices.

Many chip packages include a redistribution layer between the IC die and the package substrate, which includes additional input/out (I/O) pad that laterally extend or fan out signal carrying lines of the IC die. The use of dielectric layers, complex routing, and metal selection are utilized to ensure that signals, power, and data are separated and arrive at their intended destination within the chip package with minimal signal degradation. As chip packages become smaller, manufacturers are challenged to ensure that signal quality remains high as the distance between metal layers decreases with each successive generation of chip packages. Because the redistribution layer is often directly connected to the IC die, the importance of redistribution layer design is paramount to signal quality, as well as the manufacture of metal layers and dielectrics that reduce capacitive loading, cross-talk, and signal return loss.

Therefore, a need exists for a chip package with an improved redistribution layer.

SUMMARY

Disclosed herein is a chip package and method for fabricating the same that includes a redistribution layer (RDL) with a plurality of loop and void structures. In one example, the chip package includes an integrated circuit (IC) die, an RDL and a package substrate. The RDL is disposed between the IC die and the package substrate. The RDL has RDL circuitry that connects the IC die to the package substrate. The RDL circuitry includes a first coil formed in a first metal layer and a second coil formed in a second metal layer. A first end of the second coil is coupled to a second end of the first coil by a first via. A second end of the second coil is the IC die.

In another example, a chip package includes an integrated circuit (IC) die, a package substrate having a die side and a ball side, and a redistribution layer (RDL). The RDL is disposed between the IC die and the die side of the package substrate. The RDL has at least a first conductive layer and a second conductive layer that are patterned to form RDL circuitry within the RDL. The RDL circuitry connects the IC die to the package substrate. The RDL circuitry further includes a third metal layer that has a first plurality of apertures, and a first contact pad coupled to a first trace. The first trace is arranged in a first coil. A first end of the first coil is coupled to the first contact pad. An intermediate metal layer has a second plurality of apertures, and a second trace. The second trace is arranged in a second coil. A first end of the second coil is coupled to a second end of the first coil by a first via.

BRIEF DESCRIPTION OF THE DRAWINGS

So that the manner in which the above recited features of the present invention can be understood in detail, a more particular description of the invention, briefly summarized above, may be had by reference to examples, some of which are illustrated in the appended drawings. It is to be noted, however, that the appended drawings illustrate only typical examples of this invention and are therefore not to be considered limiting of its scope, for the invention may admit to other equally effective examples.

To facilitate understanding, identical reference numerals have been used, where possible, to designate identical elements that are common to the FIG.s. It is contemplated that elements of one example may be beneficially incorporated in other examples.

DETAILED DESCRIPTION

Disclosed herein is a chip package and method for fabricating the same having a redistribution layer with loop and void structures formed therein. Due to the nature of thin dielectric layer and solid mesh pattern in metal layer above under bump metal (UBM) ball pads, the high density of metal can induce significant capacitance loading on adjacent metal layers. The strong capacitance induced to under bump metallization (UBM) ball pads can cause signal transmission characteristic impedance discontinuity, and is the primary cause signal return loss for a specified data transfer rate in a desired frequency spectrum.

Conventionally, in order to reduce the capacitance induced to the ball grid array (BGA) pads is to remove the metal layers above the BGA pads, by cutting out the metal layer on layers above BGA ball pads. However, in conventional redistribution layer (RDL) designs, large metal voids above the UBM/BGA pad will cause metal density issues, which can lead to RDL heat dissipation issues and undesirably contribute to warpage.

Advantageously, the loop and void structures disclosed herein reduces the capacitance induced to the UBM/BGA pads from the adjacent metal layer above the pads. In order to reduce capacitance loading, an inductance is introduced by coil routing. In this manner, inductance is increased and undesirable capacitance loading is decreased in signal receiving bond pads. The coupled loop and void structures increase inductance which compensates for capacitance in the adjacent metal layers, thus improving the return loss in the frequency spectrum in the specific data transfer rate. For example, at a frequency between 6.0 GHz and 6.5 GHz, a redistribution layer having the loop and void structure disclosed herein has about −4 dB less signal return loss than a conventional redistribution layer.

Figure 1:
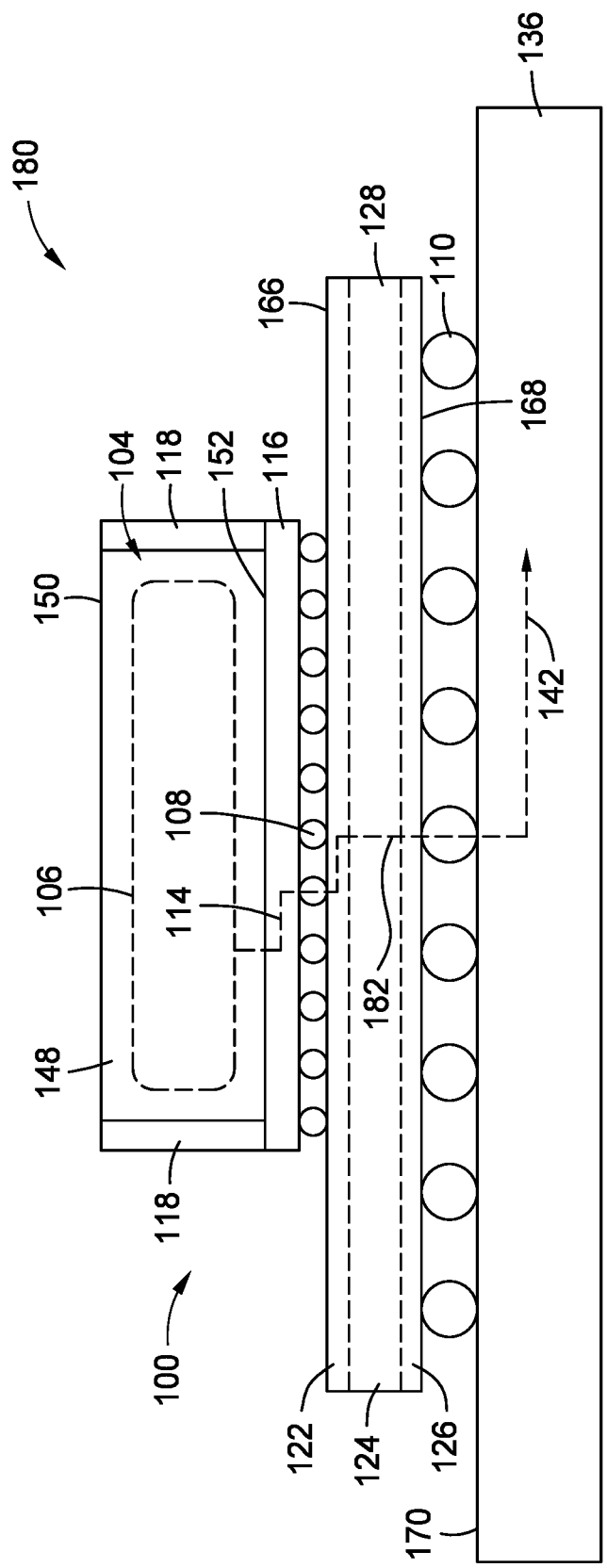
FIG. 1 is a schematic sectional view of another example of chip package having loop and void structures disposed in a redistribution layer (RDL) disposed between an integrated circuit (IC) die and a package substrate of the chip package.

Turning now to FIG. 1, a schematic sectional view of a chip package 100 is illustrated. The chip package 100 includes at least one integrated circuit (IC) die 104, a redistribution layer (RDL) 116 and a package substrate 128. The RDL 116 is formed on the lower surface of the IC die 104. The RDL 116 is coupled to the package substrate 128. The package substrate 128 of the chip package 100 may be mounted on a printed circuit board (PCB) 136 to form an electronic device 180. The RDL 116 includes loop and void structures (later shown and described with reference to FIGS. 7 and 8) that provides inductance that compensates for capacitance, beneficially resulting in reduced return loss in the frequency spectrum for signal transmission through the conductors of the RDL 116.

Continuing to refer to FIG. 1, the IC die 104 of the chip package 100 includes functional circuitry 106. The functional circuitry 106 may include block random access memory (BRAM), UltraRAM (URAM), digital signal processing (DSP) blocks, configurable logic elements (CLEs), and the like. The IC die 104 may be, but is not limited to, programmable logic devices, such as field programmable gate arrays (FPGA), memory devices, such as high bandwidth memory (HBM), optical devices, processors or other IC logic structures. The IC die 104 may optionally include optical devices such as photo-detectors, lasers, optical sources, and the like. In the example of FIG. 1, the IC die 104 is a logic die having math processor (also known as math engine) circuitry for accelerating machine-learning math operations in hardware, such as self-driving cars, artificial intelligence and data-center neural-network applications.

Optionally, the at least one IC die 104 may be a plurality of IC dies 104. When a plurality of IC dies 104 are utilized, the IC die 104 may be disposed in a vertical stack and/or disposed laterally side by side. It is contemplated that the one or more IC dies 104 of the plurality of IC dies 104 may be the same or different types. Although only one IC die 104 is shown in FIG. 1, the number of IC dies 104 disposed in the chip package 100 may vary from one to as many as can fit within the chip package 100. Additionally, one or more of the IC dies 104 may optionally be configured as a chiplet.

The IC die 104 includes a die body 148 having a die bottom surface 152 and a die top surface 150. The functional circuitry 106 is disposed within the die body and includes routing that terminates on the die bottom surface 152 of the IC die 104, for example at contact pads (later shown in FIG. 2).

The RDL 116 is formed on the contact pads exposed on the die bottom surface 152 of the IC die 104. The RDL 116 includes routing formed from a plurality of patterned metal layers disposed between a plurality of dielectric layers. The patterned metal layers are coupled by vias to form interconnect circuitry 114 of the RDL 116 that connect the functional circuitry 106 to package circuitry 182 formed in the package substrate 128. In the example depicted in FIG. 1, the interconnect circuitry 114 of the RDL 116 is electrically and mechanically coupled to the package circuitry 182 formed in the package substrate 128 by interconnects 108. In one example, the interconnects 108 are solder connections, such as solder bumps. The interconnects 108 may alternatively be formed by a hybrid bond layer or other suitable technique.

In some examples such as depicted in FIG. 1, the RDL 116 is wider than the IC die 104 to accommodate a fan out using interconnect circuitry 114 of the RDL 116. When the RDL 116 is wider than the IC die 104, a mold compound 118 surrounding the lateral sides of the IC die 104 may be utilized to provide structural support for portions of the RDL 116 that extend beyond the sides of the IC die 104.

Figure 2:
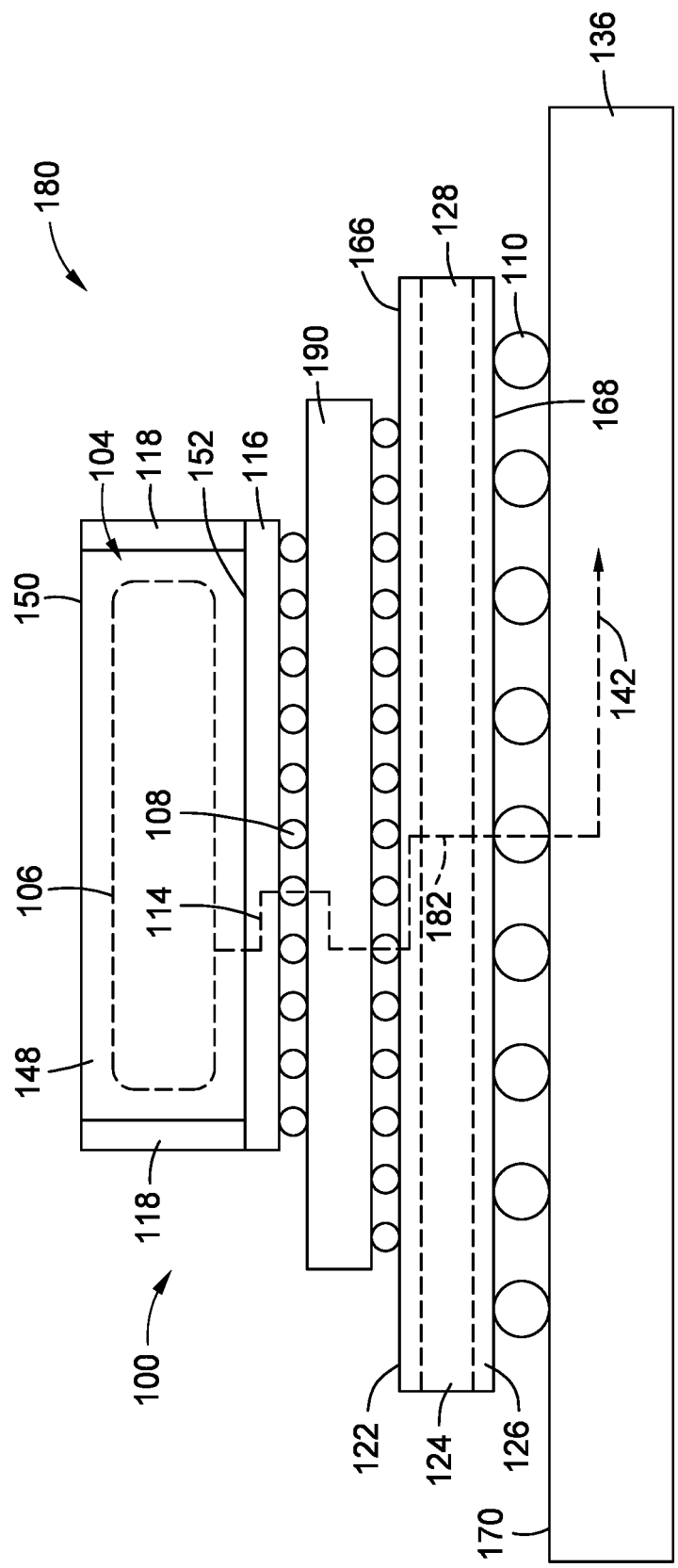
FIG. 2 is a schematic sectional view of another example of chip package having loop and void structures disposed in a redistribution layer (RDL) disposed between an integrated circuit (IC) die and an interposer of the chip package.

Although the RDL 116 is shown disposed contacting the IC die 104 in FIG. 1, the RDL 116 may alternatively or additionally be located in other portions of the chip package 100 illustrate in FIG. 1, or other chip packages having alternative configurations. For example, as depicted in FIG. 2, the chip package 100 includes an interposer 190 disposed between the package substrate 128 and the IC die 104. As shown in FIG. 2, the chip package 100 illustrates an RDL 116 disposed in three alternative or potential locations. The chip package 100 of FIG. 2 may have the RDL 116 in any one of the locations shown, any two of the locations shown, or all of the locations shown in FIG. 2.

Continuing to refer to FIG. 1, the package substrate 128 generally includes at least an upper build-up layer 122 disposed on a core 124. Optionally, a lower build-up layer 126 may be disposed on the other side of the core 124 from the upper build-up layer 122. The upper build-up layer 122 includes a plurality of conductive layers and vias that are patterned to provide routing of a portion of the package circuitry 182. One end of the package circuitry 182 formed in the upper build-up layer 122 terminates at the bond pad formed on the top surface 166 of the package substrate 128 where the package circuitry 182 connects to the interconnect circuitry 114 of the RDL 116. The other end of the package circuitry 182 formed in the upper build-up layer terminates at vias formed through the core 124. The lower build-up layer 126 may be fabricated similar to the upper build-up layer 122. At least one of the upper and lower build-up layers 122, 126 includes a fan out in the package circuitry 182 of the package substrate 128.

In examples where the package substrate 128 does not include a lower build-up layer 126, the vias formed through the core 124 of the package circuitry 182 may be connected by solder balls 110 to circuitry 142 of the PCB 136 that terminates at a PCB top surface 170 of the PCB 136. In examples having a lower build-up layer 126, the vias formed through the core 124 are coupled through the patterned conductive layers and vias of the lower build-up layer 126 such that the package circuitry 182 terminates at a package bottom surface 168. At the package bottom surface 168, the package circuitry 182 is coupled to the circuitry 142 of the PCB 136 by the solder balls 110.

Figure 3:
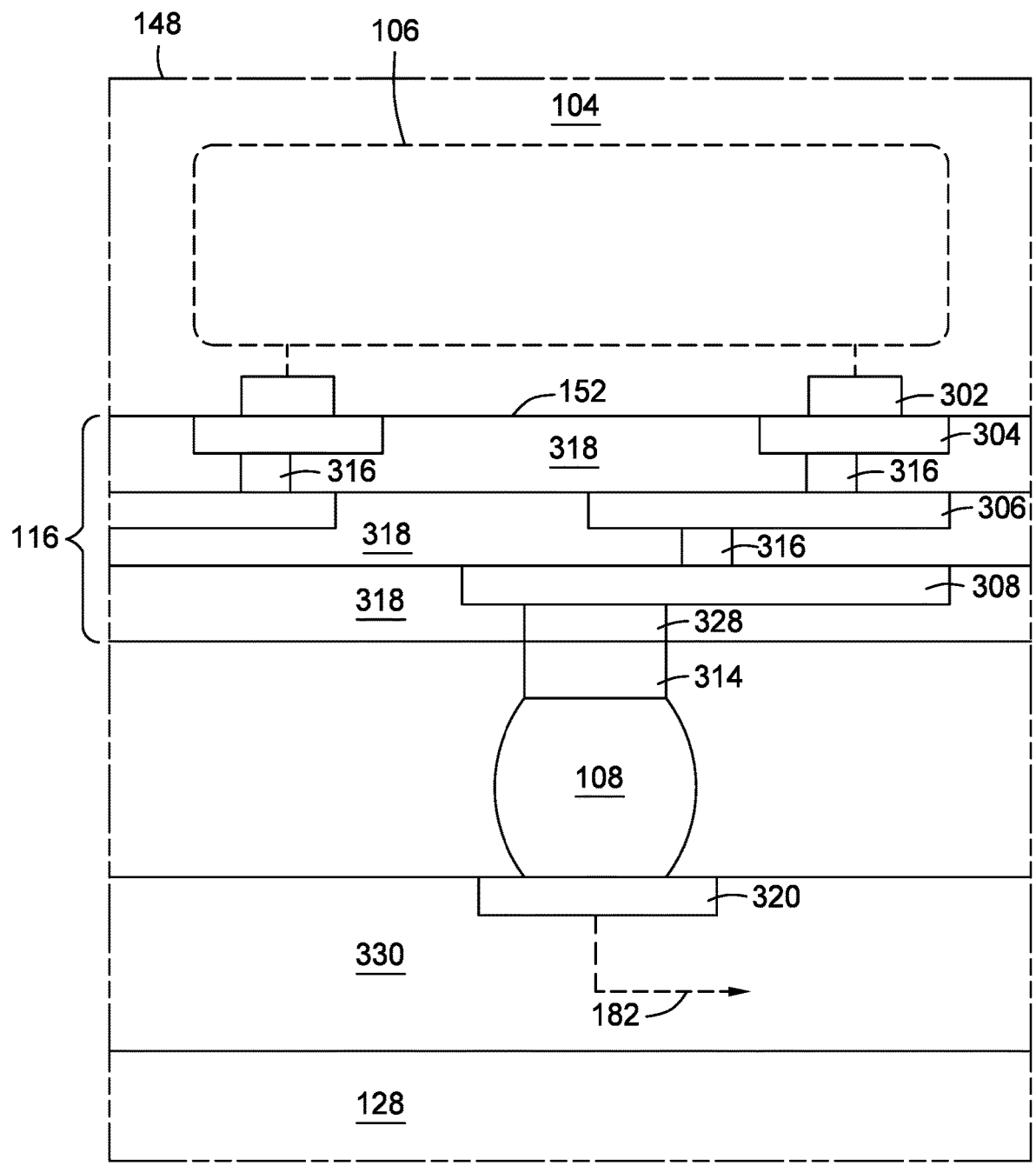
FIG. 3 is a schematic sectional view of a portion of the chip package illustrating one example of the connections between an integrated circuit (IC) die and a package substrate through loop and void structures of a redistribution layer (RDL).

FIG. 3 is a schematic sectional view of a portion of the chip package 100 illustrating one example of the connections between the IC die 104 and the package substrate 128 through the RDL 116. A portion of the 148 body is shown in FIG. 3, showing the IC die 104 disposed on top of and in contact with the RDL 116, and the package substrate 128 electrically connected to the RDL 116 by interconnects 108.

The RDL 116 includes 3 or more patterned metal layers separated by dielectric layers 318. The patterned metal layers are interconnect by vias 316 to form routing of the circuitry 114 disposed in the RDL 116. Although in the example depicted in FIG. 3 the 3 or more patterned metal layers are illustrated as a first metal layer 304, second metal layer 306, and a third metal layer 308, alternatively additional metal layers may be present in the RDL 116. The patterned conductive layers 304, 306, 308 are separated by dielectric layers 318. For example, the RDL 116 can include three to seven or more patterned conductive layers that form the interconnect circuitry 114. The second metal layer 306 is disposed between the first metal layer 304 and the third metal layer 308. The first metal layer 304 is in contact with contact pads 302 and the third metal layer 308 is in contact with an under-bump metal layer 314. As discussed above, the conductive layers 304, 306, 308 are patterned to form lines that are connected by vias 316 to form the interconnect circuitry 114 of the RDL 116.

The one end of the routings comprising the interconnect circuitry 114 terminates at the first metal layer 304. The routing terminations of the interconnect circuitry 114 at the first metal layer 304 are coupled to contact pads 302 formed on the bottom surface 152 of the IC die 104. The other end of the routings comprising the interconnect circuitry 114 terminates at the third metal layer 308. The routing terminations of Interconnect circuitry 114 at the third metal layer 308 are coupled through a bond pad 328 to an under-bump metal layer 314 upon which the interconnect 108 is formed. The interconnect 108 couples the interconnect circuitry 114 to a bond pad formed on a top surface 166 of the package substrate 128, thus connecting the interconnect circuitry 114 to the package circuitry 182 of the package substrate 128. Contact pads 320 are disposed on a build-up layer 330 of the package substrate 128, the package circuitry 182 coupled thereto. The RDL 116 contacts the bottom surface 152 of the IC die 104. The RDL 116 contacts a top of the package substrate 128. Alternatively, the RDL 116 contacts the interposer 190 disposed between IC die 104 and the package substrate 128.

Figure 4:
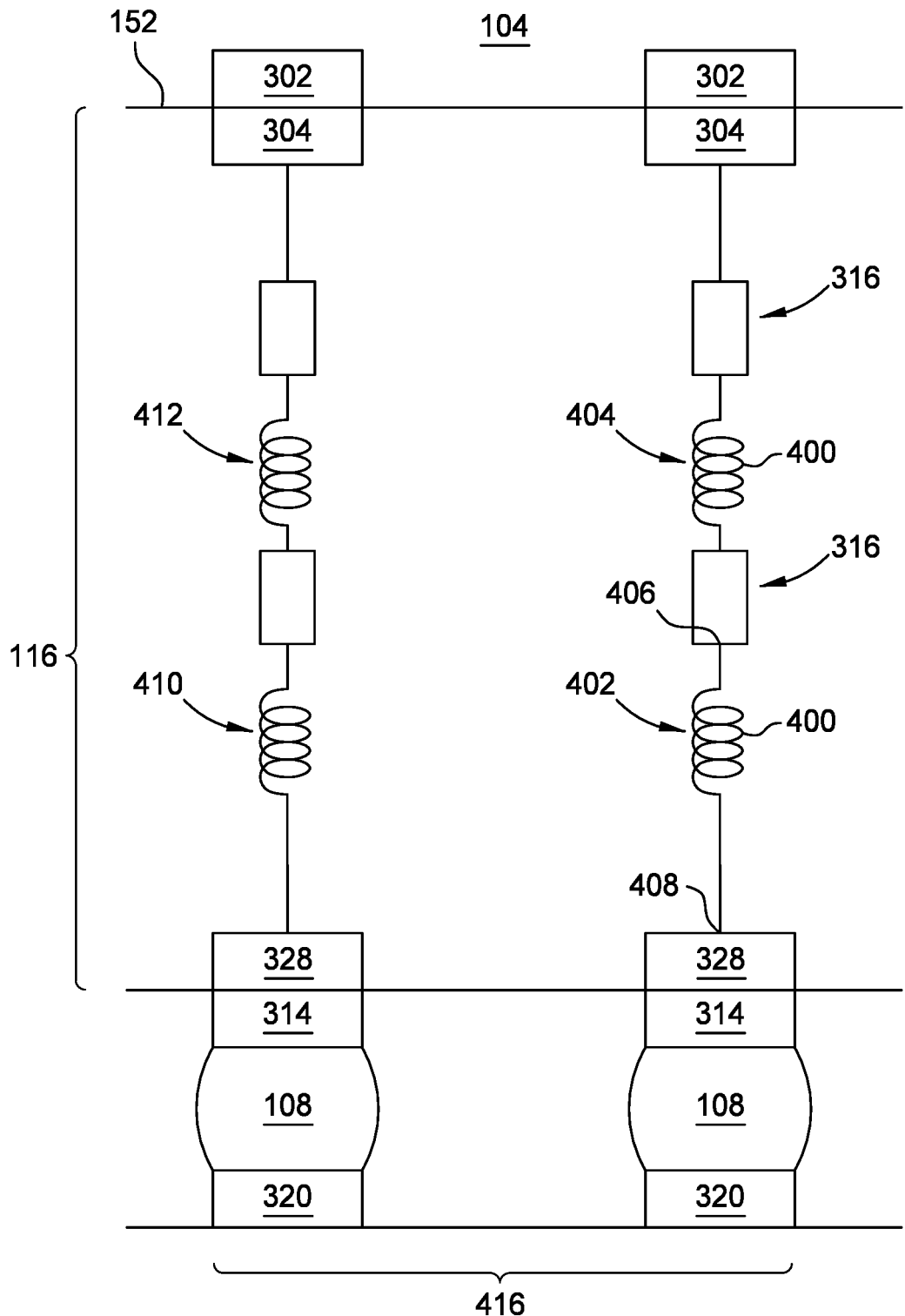
FIG. 4 is a schematic circuit diagram of loop and void structures for routing a differential signal pair within a redistribution layer (RDL).

FIG. 4 is a schematic circuit diagram of one example of loop and void structures that can be fabricated in an RDL 116 to provide signal transmission routing for a differential signal pair 416. It is contemplated that loop and void structures having other configurations may be fabricated within the patterned metal layers of the RDL 116. For example, each signal transmission routing formed through the RDL 116 includes a first coil 402 and second coil 404 (i.e., loops) coupled by a via 316 that electrically connects the IC die 104 to an interconnect 108 disposed on each side of the RDL 116. The first coil 402 and second coil 404 are made of traces 400 formed from a different metal layer of the RDL 116. Each trace 400 terminates at an upper coupling 406 and a lower coupling 408.

The lower coupling 408 of the first coil 402 is physically coupled to the bond pad 328 formed in the third metal layer 308. The upper coupling 406 of the first coil 402 is physically coupled to the via 316. The via 316 is coupled to the lower coupling 408 of the second coil 404. The second coil 404, which is made from the second metal layer 306, terminates at the upper coupling 406. The upper coupling 406 of the second coil 404 is coupled by the via 316 to the first metal layer 304. The first metal layer 304 is coupled to the contact pad 302 of the IC die 104. The first coil 402 forms a first half of an inductor, and the second coil 404 forms the second half of the inductor formed in each the signal transmission routing passing through the RDL 116. The neighboring signal transmission routing forming the other half of the differential signal pair 416 includes coils 410, 412 that are configured similar to the coils 402, 404.

When the metal layers 306, 308 forming the inductor are stacked, the first coil 402 overlaps the second coil 404. In one example, the traces 400 forming the coils 402, 404 turns in the same direction. In another example, the first coil 402 is aligned directly over the second coil 404. Each contact pad 320 and their respective coils 402, 404 and 410, 412 form a portion of the routing (i.e., package circuitry 182) of the differential signal pair 416. The neighboring signal transmission routings of the differential signal pair 416 are symmetric about a midpoint between the first contact pad 320 and second contact pad 320. For example, the coils 402, 404 may both turn the same (clock-wise) direction, while the coils 410, 412 both turn in the opposite (counter clock-wise) direction, or vise verse.

Traces 400 of the coils 402, 404, 410, 412 are formed in a helical structure that spirals about a center line (aligned with the via 316) and terminates at upper and lower couplings 406, 408. The lower coupling 408 is made from a portion of the third metal layer 308 and is physically coupled to the bond pad 328. The upper coupling 406 is formed from the second metal layer 306 and is physically coupled to the via 316 disposed in the second metal layer 306. Advantageously, the coupled helical routing structure of the coils 402, 404, 410, 412 creates an inductance that compensates for capacitance that would otherwise be increased in the presence of metal proximate the interconnects 108.

The interconnect 108 is disposed in between and in contact with the under-bump metal layer 314. The substrate 418 can be either one of the package substrate 128 or the interposer 190, shown in FIGS. 1-2. Two adjacent contact pads 320 form the differential signal pair 416. The differential signal pair 416 is also referred to a P/N pair, where signals transmitted along one contact pad 320 can be 180 degrees out of phase with signals transmitted along the other contact pad 320 of the differential signal pair 416.

Figure 5:
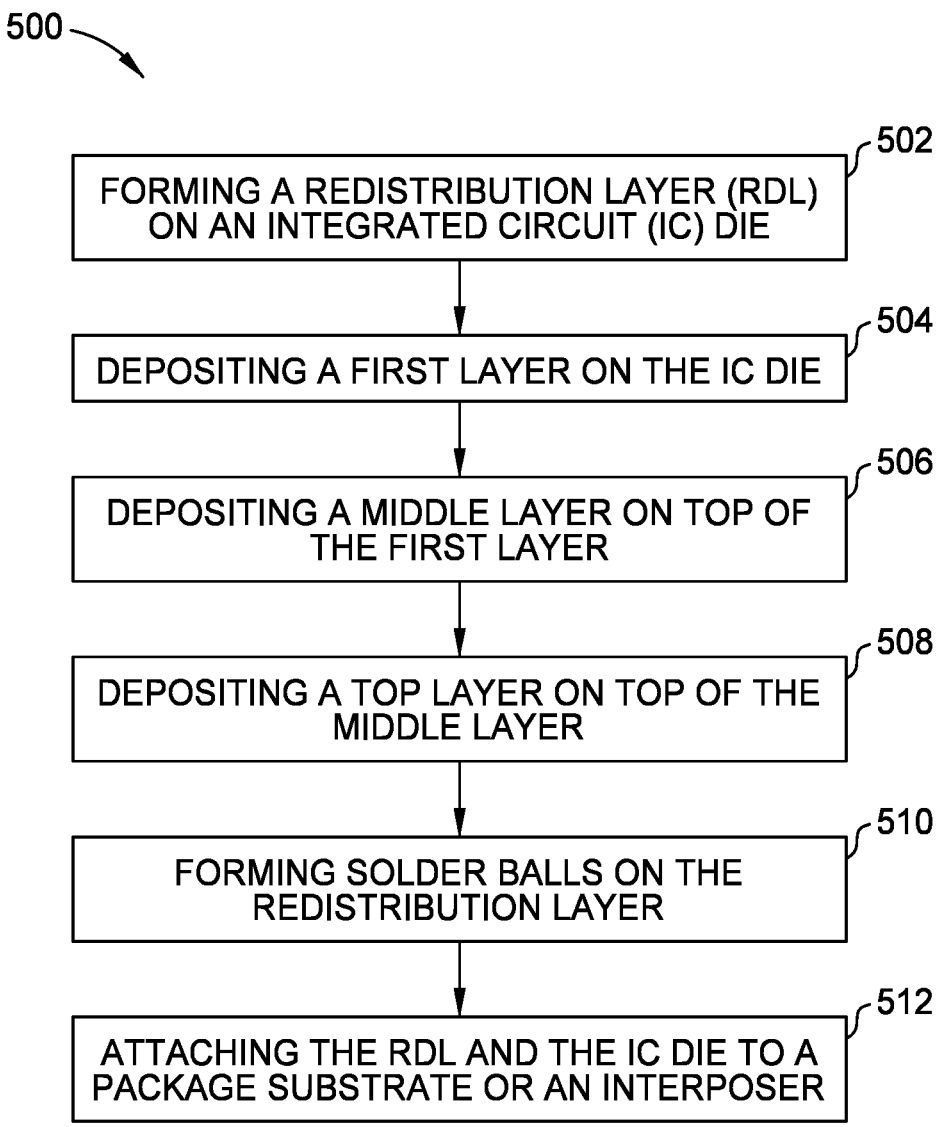
FIG. 5 is a flow diagram of a method for fabricating a chip package having loop and void structures fabricated within a redistribution layer (RDL) adjacent an integrated circuit (IC) die.
Figure 6:
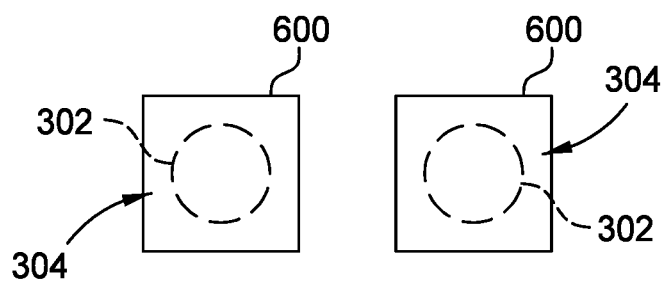
FIGS. 6-8 are a sequence of schematic bottom views depicting loop and void structures during various stages of fabrication within the redistribution layer (RDL).
Figure 7:
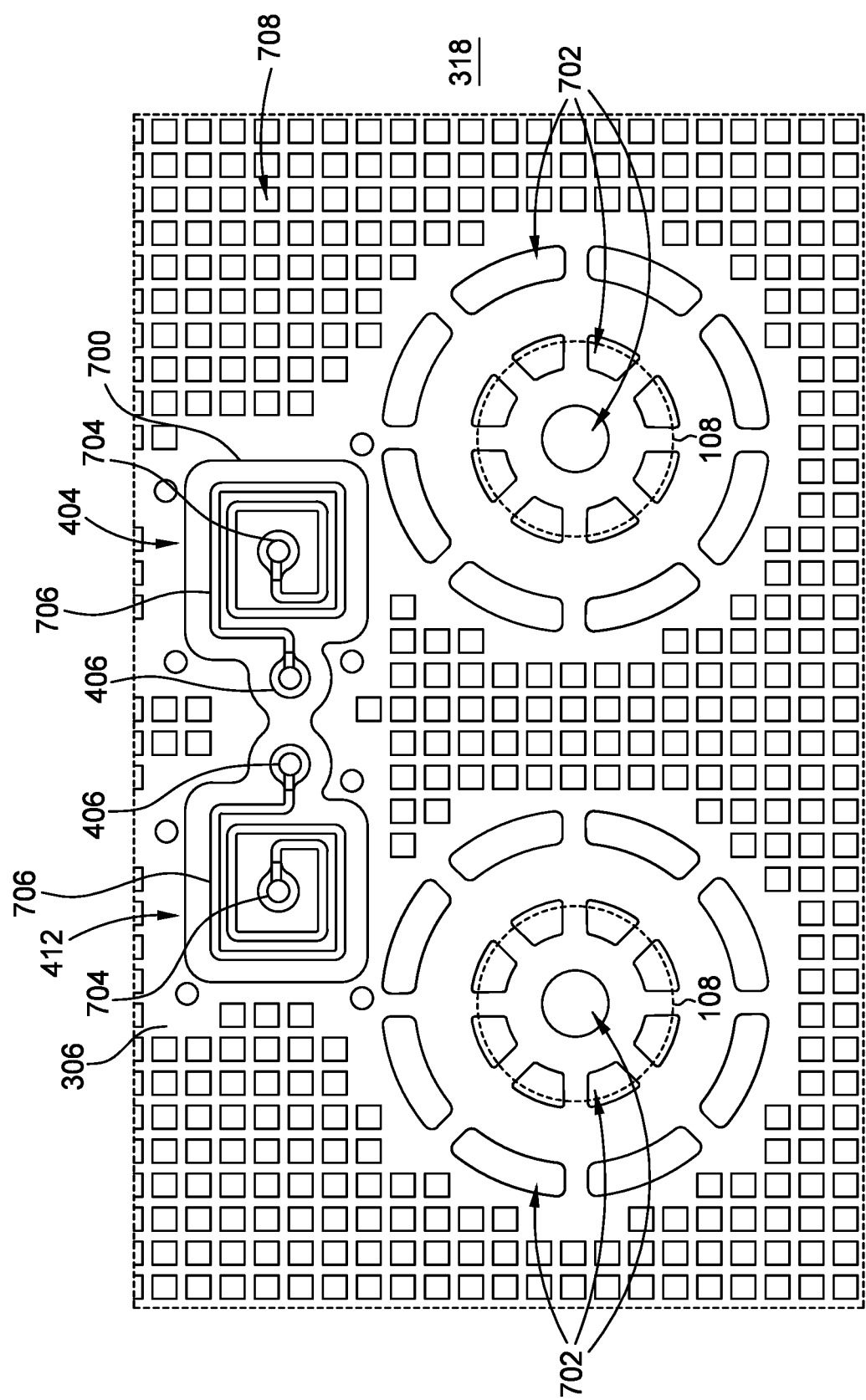
Figure 8:
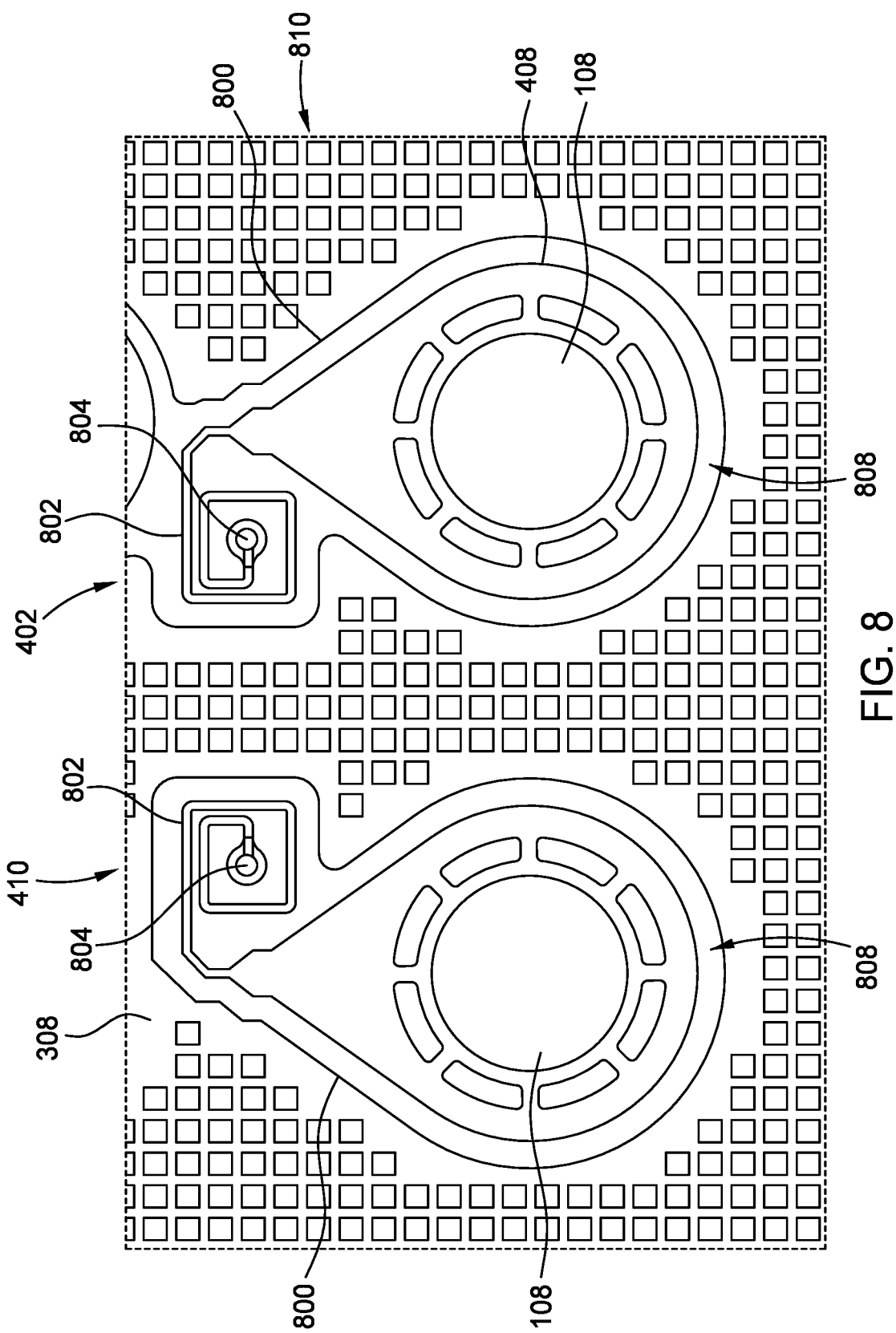

FIG. 5 is a flow diagram of a method 500 for fabricating a chip package 100 having loop and void structures fabricated within the RDL 116 adjacent the IC die 104. FIGS. 6-8 are a sequence of schematic bottom views of different layers of the RDL 116 depicting the loop and void structures during various stages of fabrication. FIG. 3 will also be referred to as well during the discussion of the method 500. The chip packages having loop and void structures fabricated within the RDL may also be fabricated utilizing different techniques. The loop and void structures can be present for one or more of the signal carrying routings passing through the RDL 116.

The method 500 starts at operation 502, where a redistribution layer is formed on an integrated circuit (IC) die. For example, the RDL 116 can be formed on the IC die 104 shown in FIG. 1 or FIG. 2.

At operation 504, the method 500 proceeds by depositing a first metal layer on the IC die. As shown in FIGS. 3 and 6, the first metal layer 304 is deposited on the IC die 104 and patterned to form contact pads 600. The contact pads 600 are formed on and in electrical connection with the contact pads 302 of the IC die 104. Operation 504 also include depositing a dielectric layer 318 over the first metal layer 304, and forming vias 316 through the dielectric layer 318 that are connected to the contact pads 600.

The method 500 continues to operation 506, where a second metal layer 306 is deposited on top of the dielectric layer 318 covering first metal layer 304. The second metal layer 306 can be formed from a metal such as copper (Cu) or other suitable material. FIG. 7, shows a portion of the second metal layer 306. The second metal layer 306 is patterned to form, among other things, traces 706 and a first hole 700 (i.e. void structure). Some of the traces 706 form the second coil 404 and some of the traces 706 form the fourth coil 412. The traces 706 are formed in the first hole 700. The traces 706 of the fourth coil 412 is separate and electrically isolated from the traces 706 of the second coil 404. The traces 706 are terminated on one end by the upper coupling 406 and on a second end by a first lead 704. The upper coupling 406 of each coil 404, 412 is coupled by a respective via 316 to a respective one of the contact pads 600 illustrated in FIGS. 3 and 6.

Operation 506 also include depositing a dielectric layer 318 over the second metal layer 306, and forming vias 316 through the dielectric layer 318 that are connected to the first leads 704 of the coils 404, 412.

The trace 706 forming the first coil 402 is formed in a spiral around a center of the first coil 402. Additionally, the first coil 402 has at least 1.5 full turns around a center of the first coil 402. For example, as shown in FIG. 7, the trace 706 spirals around the first lead 704 at least 1.5 times, but is not limited to this configuration. An increase in the number of spirals in the trace 706 increases the inductance created by the spiraled trace 706.

A first plurality of apertures 708 are disposed in the second metal layer 306. The dielectric layer 318 surrounds the second metal layer 306.

In addition to the hole 700, the second metal layer 306 additionally includes a first plurality of apertures 708 and a plurality of second holes 702. The apertures and holes 700, 702, 708 assist in reducing the capacitance between the metal layers of the RDL 116.

The plurality of second holes 702 are formed adjacent to the first hole 700. The plurality of second holes 702 are disposed centered above the interconnect 108, which is shown in phantom, of the differential pair of signal traces. The plurality of second holes 702 formed by patterning the second metal layer 306.

The first plurality of apertures 708 are disposed between the second holes 702. Advantages of the first plurality of apertures 708 and the second holes 702 can reduce the capacitance loading on metal layers beneath the apertures 708 and second holes 702.

At operation 508, the third metal layer 308 is deposited and patterned on top of the dielectric layer 318 covering the second metal layer 306. Vias 316 connect portions of the second metal layer 306 to portions of the third metal layer 308 to form the RDL interconnect circuitry 114, as illustrated in FIG. 8.

In FIG. 8, a second plurality of holes 800 (i.e., void structures), traces 802, second lead 804, and a second plurality of apertures 810 are formed in the third metal layer 308. The third metal layer 308 can be formed from a metal, such as Cu or other suitable material. The lower coupling 408 of the first coil 402 is coupled to a subpad 808 also formed in third metal layer 308. The subpad 808 of the third metal layer 308 is directly below the interconnect 108, and is concentrically aligned with the holes 702 formed in the second metal layer 306. The subpad 808 is electrically coupled to interconnect 108 through the under-bump metal layer 314 and the bond pad 328, shown in FIG. 3. As also shown in FIG. 3, the bond pad 328 is coupled to the under-bump metal layer 314 enabling signals to travel from the IC die 104 through the package circuitry 182 to the interconnect 108.

Continuing to refer to FIG. 8, the second lead 804 terminates the traces 802 of the first coil 402 and third coil 410. Each second lead 804 is coupled by a respective via 316 to the first lead 704 of the coils 404, 410 form in the second metal layer 306. The traces 802 of the first coil 402 are mechanically and electrically coupled to the subpad 808. The subpad 808 is electrically coupled to the traces 706 shown in FIG. 7. The traces 706 are coupled to traces 802 through the via 316, illustrated in FIGS. 3 and 4.

The second plurality of apertures 810 is disposed in the third metal layer 308. The second plurality of apertures 810 surround each hole of the second plurality of holes 800. The second plurality of apertures 810 are also disposed between adjacent second holes 800 of the third metal layer 308. The traces 802 form the structure of the second coil 404 in the third metal layer 308, and thus make up the other one half of the inductor of the signal transmission trace.

Within a signal transmission trace, the traces 802 of the second coil 404 are wound in the same direction as the traces 706 of the first coil 402. However, the traces 802, 706 each signal transmission trace of a differential signal pair 416 are wound in opposite directions.

Operation 508 also includes depositing a dielectric layer 318 over the third metal layer 308, and forming the under-bump metal layers 314 and bond pads 328.

At operation 510, the method 500 proceeds by forming solder balls on the redistribution layer 116, as shown in FIG. 3. As shown, solder balls (e.g., interconnects 108) are formed over the bond pad 328 of the RDL 116. The under-bump metal layer 314 is physically and electrically connected to each of the bond pad 328 and interconnects 108.

The method 500 continues to operation 512, where the redistribution layer and the IC die are attached to a package substrate 128 or an interposer 190. For example, as shown in FIG. 1, the RDL 116 and the IC die 104 are attached to the package substrate 128. In another example as shown in FIG. 2, the RDL 116 and IC die 104 are attached to the interposer 190 prior to attaching interposer 190 to the package substrate 128, and thus coupling the RDL 116 and IC die 104 to the package substrate 128.

Thus, a chip package and method for fabricating the same are provided that includes a redistribution layer with a plurality of loop and void structures. Advantageously, the loop and void structures reduce capacitive loading in signal receiving bond pads, thus improving signal quality. While the foregoing is directed to examples of the present invention, other and further examples of the invention may be devised without departing from the basic scope thereof, and the scope thereof is determined by the claims that follow.

What is claimed is:
1. A chip package comprising:
an integrated circuit (IC) die;
a package substrate having a die side and a ball side; and
a redistribution layer (RDL) disposed between the IC die and the die side of the package substrate, the RDL comprising a plurality of conductive layers patterned to form RDL circuitry within the RDL, the RDL circuitry connecting the IC die to the package substrate; wherein the plurality of conductive layers forming the RDL circuitry further comprise:

a first metal layer having a first contact pad coupled to a first trace, the first trace arranged in a first coil, a first end of the first coil coupled to the first contact pad; and a second metal layer having a second trace, the second trace arranged in a second coil, a first end of the second coil coupled to a second end of the first coil by a first via, wherein an opening is formed in the second metal layer that at least partially surrounds the second coil.

2. The chip package of claim 1, comprising:
a plurality of apertures in the second metal layer, wherein at least a portion of the plurality of apertures are formed adjacent the opening that surround the second coil.

3. The chip package of claim 1, comprising:
a solder ball disposed on the first contact pad.

4. The chip package of claim 1, wherein the RDL further comprises:
a third metal layer having bond pads connected to contact pads of the IC die and to the second coil.

5. The chip package of claim 1, wherein the first coil overlaps the second coil.

6. The chip package of claim 5, wherein the first coil is aligned over the second coil.

7. The chip package of claim 5, wherein the first coil and the second coil turn in a same direction.

8. The chip package of claim 1, wherein the first coil has square turns around a center of the first coil.

9. The chip package of claim 1, wherein the first coil is a spiral around a center of the first coil.

10. The chip package of claim 1, wherein the first coil has at least 1.5 full turns around a center of the first coil.

11. The chip package of claim 1, further comprising:
a second contact pad and an inductor structure disposed adjacent the first coil and forming routing for half of a differential signal pair.

12. The chip package of claim 11, wherein the differential signal pair is symmetrical about a midpoint between the first contact pad and the second contact pad.

13. The chip package of claim 1, wherein the RDL contacts a bottom of the IC die.

14. The chip package of claim 1, wherein the RDL contacts a top of the package substrate.

15. The chip package of claim 1, wherein the RDL contacts an interposer disposed between the IC die and the package substrate.

16. A chip package comprising:
an integrated circuit (IC) die;
a package substrate having a die side and a ball side; and
a redistribution layer (RDL) disposed between the IC die and the die side of the package substrate, the RDL comprising at least a first conductive layer and a second conductive layer that are patterned to form RDL circuitry within the RDL, the RDL circuitry connecting the IC die to the package substrate; wherein the RDL circuitry further comprise:
a first metal layer having a first plurality of apertures, and a first contact pad coupled to a first trace, the first trace arranged in a first coil, a first end of the first coil coupled to the first contact pad; and
a second metal layer having a second plurality of apertures, and a second trace, the second trace arranged in a second coil, a first end of the second coil coupled to a second end of the first coil by a first via, wherein an opening is formed in the second metal layer that at least partially surrounds the second coil.

17. The chip package of claim 16, comprising:
a solder ball disposed on the first contact pad.

18. The chip package of claim 16, comprising:
a third metal layer having bond pads connected to contact pads of the IC die.

19. The chip package of claim 16, wherein the first coil overlaps the second coil.

20. The chip package of claim 19, wherein the first coil and the second coil turn in a same direction.

* * * * *